United States Patent [19]

Atwell

[11] Patent Number: 4,833,422

[45] Date of Patent: May 23, 1989

[54] PROGRAMMABLE GAIN INSTRUMENTATION AMPLIFIER

[75] Inventor: Robert N. Atwell, Tucson, Ariz.

[73] Assignee: Burr-Brown Corporation, Tucson, Ariz.

[21] Appl. No.: 100,556

[22] Filed: Sep. 24, 1987

[51] Int. Cl.$^4$ .............................................. H03F 3/45
[52] U.S. Cl. .................................... 330/254; 330/283; 330/300
[58] Field of Search ............... 330/253, 254, 257, 283, 330/300, 311

[56] References Cited

U.S. PATENT DOCUMENTS

| | | | |
|---|---|---|---|
| 3,940,708 | 2/1976 | Sumi et al. .............................. | 330/29 |
| 4,341,962 | 7/1982 | Buff ....................................... | 307/492 |
| 4,621,238 | 11/1986 | Fenk ....................................... | 330/254 |

FOREIGN PATENT DOCUMENTS

| | | | |
|---|---|---|---|
| 2262089 | 7/1974 | Fed. Rep. of Germany ...... | 330/254 |
| 2262580 | 7/1974 | Fed. Rep. of Germany ...... | 330/254 |
| 2275070 | 1/1976 | France ................................. | 330/254 |
| 23009 | 3/1981 | Japan .................................... | 330/254 |
| 0047307 | 3/1983 | Japan .................................... | 330/254 |

OTHER PUBLICATIONS

"Session XVI: Analog Circuit Techniques" Van de Plassche, 1975, IEEE International Solid-State Circuits Conference, pp. 194-195.
"AMP-O1 Low-Noise Precision Instrumentation Amplifier", Precision Monolithics, Inc., 1/86, Rev. A, p. 6-5.
"Low-Power High Accuracy Instrumentation Amplifier", Burr-Brown Corporation, Mar., 1985, PDS-523.

Primary Examiner—James B. Mullins
Attorney, Agent, or Firm—Cahill, Sutton & Thomas

[57] ABSTRACT

A programmable gain instrumentation amplifier includes first and second differential subcircuits, each of which includes first and second input transistors, a first constant current source, first and second gain selection transistors, an output transistor, and a second constant current source. The bases of the first and second input transistors of the first and second subcircuits are connected, respectively, to first and second input terminals. The emitters of the first and second input transistors are connected to first and second gain resistors, respectively, and also are connected to collectors of the first and second gain selection transistors, respectively. The bases of the first and second gain selection transistors of the first and second subcircuits are coupled to first and second gain selection signals, respectively. Collectors of the first and second input transistors are connected to the first constant current source. Emitters of the first and second input transistors are connected to the emitter of the output transistor and to the second constant current source. A bias circuit is connected to the control electrode of the output transistor. An output current flows through the second current carrying electrode of the output transistor. The first and second gain selection signals effectively switch the first and second gain resistors, respectively, in and out of the programmable gain instrumentation amplifier at very high speeds without producing signal glitches.

10 Claims, 3 Drawing Sheets

PROGRAMMABLE GAIN INSTRUMENTATION AMPLIFIER

SUMMARY OF THE INVENTION

The invention relates to programmable gain amplifiers, and particularly to a programmable gain instrumentation amplifier that can be conveniently implemented on a monolithic integrated circuit chip using conventional bipolar bi-fet manufacturing processes.

Figure 1:
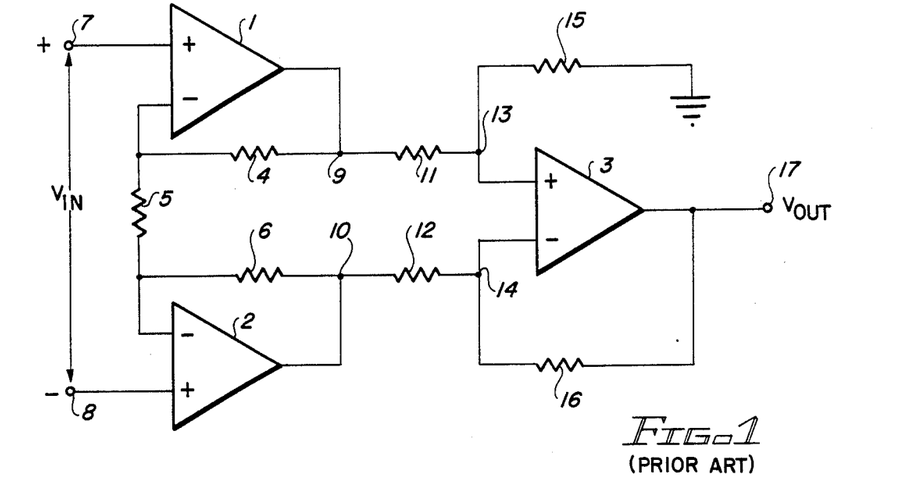
FIG. 1 is a schematic diagram of a prior art circuit.

A variety of instrumentation amplifiers are known. FIG. 1 shows a "standard" three operational amplifier instrumentation amplifier that includes two "gain cells" connected together so that a differential input signal is applied to the positive inputs of the two gain cells, and the outputs of the two gain cells are applied as a differential input to a third operational amplifier that is connected as a difference amplifier.

A problem with the prior art circuit of FIG. 1 is that it is impractical to use this design to provide a programmable gain instrumentation amplifier in a standard monolithic integrated circuit chip. In order to provide programmable gain for the circuit of FIG. 1, it would be necessary to duplicate too many transistors and resistors to achieve an efficient design. Furthermore, the common mode rejection of the instrumentation amplifier of FIG. 1 is very dependent upon the preciseness of matching of the resistors 11, 12, 15, and 16. This is undesirable because extremely precise matching of resistors with high manufacturing yields is difficult to achieve.

Figure 2:
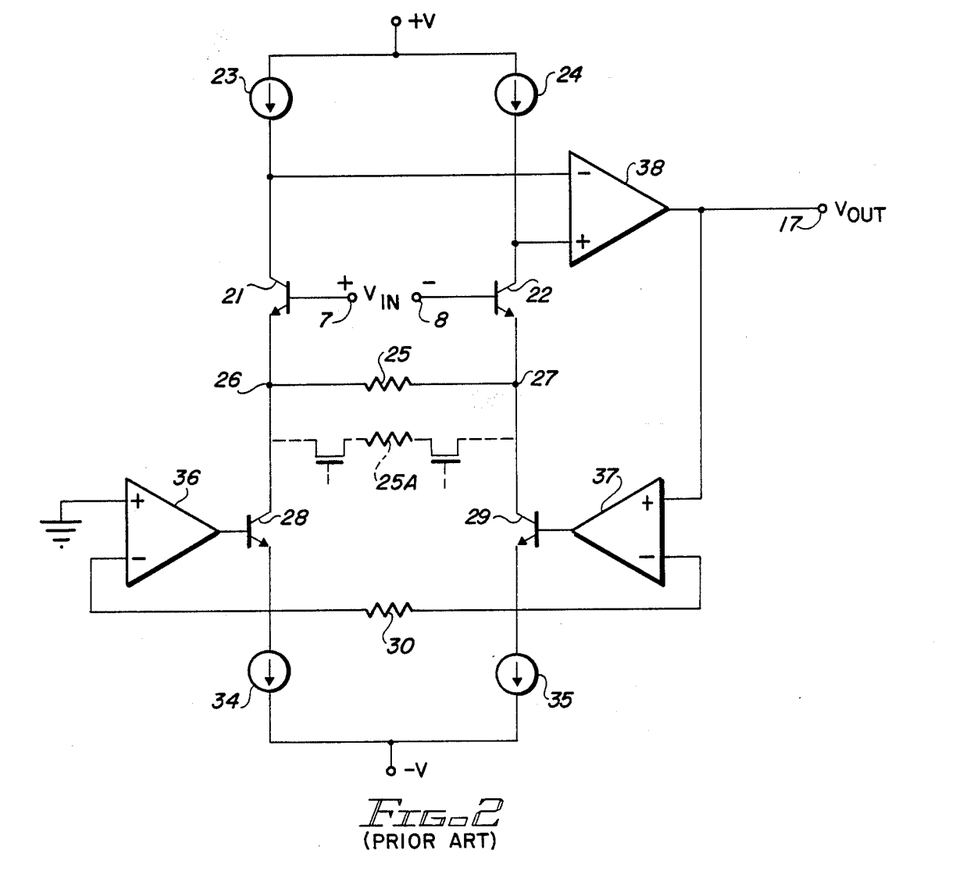
FIG. 2 is a schematic diagram of another circuit that is useful in describing the state of the art.

Another prior approach to implementing an instrumentation amplifier is shown in FIG. 2. This figure shows a circuit used by PMI (Precision Monolithics, Inc. of Santa Clara, California) in their AMPO1 and AMPO5 instrumentation amplifiers. The input signal $V_{IN}$ is buffered by emitter followers operating at constant current, with the gain resistor 25 being connected between the emitters. The differences between the driving currents 23 and 24 and the signal current through gain circuits 25 then are fed into the collectors of transistors 8 and 29, the emitters of which are connected to a scaling resistor 30 and current sources 34 and 35. The difference between the collector currents and the emitter current sources then is forced to flow in the scaling resistor 30. Voltages at the emitters of transistors 28 and 29 then are used by feedback circuits 36 and 37 to force the output of the instrumentation amplifier to be a multiple of the input signal.

Again, the instrumentation amplifier of FIG. 2 cannot be easily modified to provide programmable gain. Utilizing discrete field effect transistors (as indicated in dotted lines) to switch in additional gain resistors such as 25A appears to be the only practical technique. This approach is very inconvenient because of the necessity of using large, expensive field effect transistors in a hybrid integrated circuit device, since it is necessary that the "on" resistances of the field effect transistors be very small compared to the resistance of gain resistors 25 and 25A. Furthermore, the temperature dependence of the field effect transistors introduces errors into the gain. The large gate-to-drain capacitive coupling of the field effect transistors would greatly limit the bandwidth of a programmable instrumentation amplifier implemented in this manner. Also, the logic levels at the gates of these devices would need to track the input signal, thereby requiring complex circuitry to be included to accomplish the tracking.

It is believed that there would be a good market for a low cost, accurate, programmable gain instrumentation amplifier with high bandwidth, if such a device could be profitably marketed at a substantially lower cost than presently available programmable gain instrumentation amplifiers. Such devices would be especially useful in multiple data acquisition systems in which minute analog signals can be amplified early by a selectable amount of gain before further signal processing such as analog-to-digital conversion.

SUMMARY OF THE INVENTION

Accordingly, it is an object of the invention to provide a low cost programmable gain amplifier that is conveniently implementable on a monolithic integrated circuit chip.

It is another object of the invention to provide a programmable gain amplifier having high bandwidth.

It is another object of the invention to provide a programmable gain instrumentation amplifier having a highly symmetrical circuitry which results in rejection of imbalances due to mismatching of transistor parameters.

It is another object of the invention to provide a programmable gain instrumentation amplifier which is substantially free from effects of "glitches" in its output signal caused by switching various gain control resistors into and/or out of the circuit operation.

It is another object of the invention to provide a programmable instrumentation amplifier having short settling times.

Briefly described, and in accordance with one embodiment thereof, the invention provides a programmable gain amplifier including first, second, third, and fourth gain selection transistors, the control electrodes of the first and second gain selection transistors being connected to a first gain selection signal, the amplifier also including control electrodes of the third and fourth gain selection transistors connected to a second gain selection signal, first and second output transistors, the first current carrying electrodes of the first output transistor and the first and third gain selection transistors being coupled to a first constant current source, the first current carrying electrodes of the second output transistor and the second and fourth gain selection transistors being connected to a second constant current source. The amplifier further includes first, second, third, and fourth input transistors, the first current carrying electrodes of the first, second, third, and fourth input transistors being connected, respectively, to the second current carrying electrodes of the first, second, third and fourth gain selection transistors, the control electrodes of the first and third input transistors being connected to a first input terminal. The control electrodes of the second and fourth input transistors are connected to a second input terminal, the second current carrying electrodes of the first and third input transistors being connected to a third constant current source, the second current carrying electrodes of the second and fourth input transistors being connected to a fourth constant current source. The amplifier further includes a first gain resistor connected between the first current carrying electrodes of the first and second input transistors. The amplifier also includes a second gain resistor connected between the first current carrying electrodes of the third and fourth input transistors. The amplifier includes circuitry for biasing the control electrodes of the first and second output transistors. First and second output currents flow through the second current carrying terminals of the first and second output transistors, respectively. The gain of the amplifier is selectable to a first value determined by the first gain resistor, by turning on the first and second gain selection transistors in response to the first gain selection signal and turning the third and fourth gain selection transistors off, or to a second value determined by the second gain resistor by turning on the third and fourth gain selection transistors in response to the second gain selection signal.

In the described embodiment of the invention, a current to voltage conversion circuit includes an operational amplifier having an inverting input coupled to the second current carrying electrode of the first output transistor and also coupled by a first resistor to an output voltage conductor. A non-inverting input of the operational amplifier is coupled to the second current carrying electrode of the second output transistor and is also connected by a second resistor to a ground reference conductor. The biasing circuitry includes first and second inverting amplifiers, each connected from collectors of a pair of the input transistors to a control electrode of a corresponding one of the output transistors. In a preferred embodiment of the invention, the input transistors are PNP transistors, and the gain selection transistors and the output transistors are P-channel junction field effect transistors, and the entire amplifier is implemented as a monolithic integrated circuit.

DESCRIPTION OF THE PREFERRED EMBODIMENTS OF THE INVENTION

Figure 3:
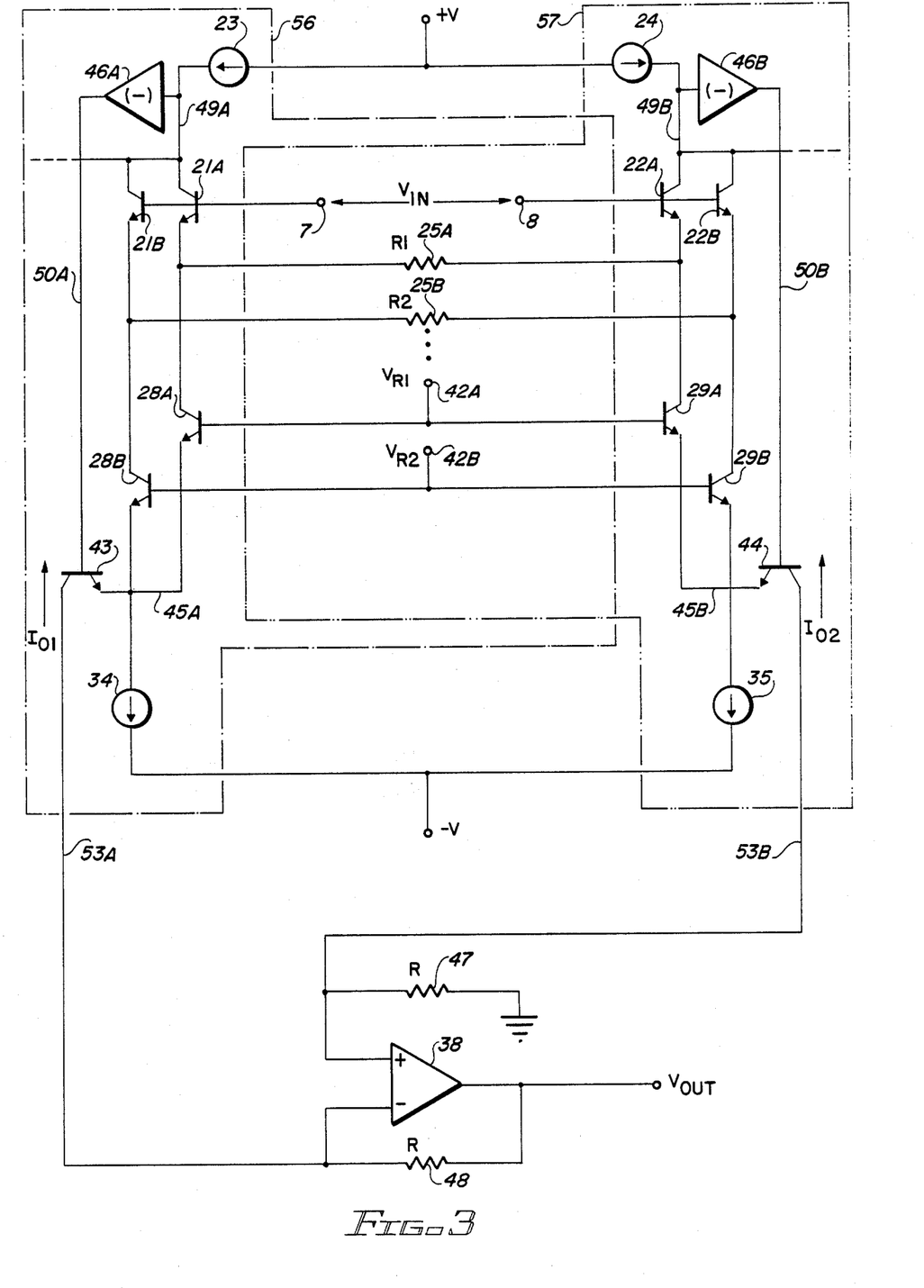
FIG. 3 is a detailed schematic circuit diagram of one embodiment of the invention.

FIG. 3 shows a bipolar transistor implementation of the invention. The instrumentation amplifier of FIG. 3 includes two input terminals 7 and 8, between which an input voltage $V_{IN}$ is applied. Input terminal 7 is connected to the bases of NPN input transistors 21A and 21B. Similarly, input terminal 8 is connected to the bases of NPN input transistors 22A and 22B. The collectors of input transistors 21A and 21B are connected to constant current source 23 and to the input of an inverting amplifier 46A, the output of which is connected to the base of NPN output transistor 43. Similarly, the collectors of input transistors 22A and 22B are connected to constant current source 24 and to an input of inverting amplifier 46B, the output 50B of which is connected to the base electrode of NPN output transistor 44. Constant current sources 23 and 24 supply equal currents from $+V$.

The emitter of input transistor 21A is connected to one terminal of a first gain resistor 25A, the resistance of which is R1, and to the collector of NPN selection transistor 28A. The base of transistor 28A is connected by conductor 42A to receive a first gain selection voltage $V_{R1}$. The emitter of transistor 28A is connected by conductor 45A to the emitter of output transistor 43 and to constant current source 34, which returns a constant current to $-V$.

Similarly, the emitter of input transistor 22A is connected to the other terminal of gain resistor 25A and to the collector of gain selection transistor 29A. The base of gain selection transistor 29A is connected to conductor 42A, and its emitter is connected by conductor 45B to the emitter of output transistor 44 and to constant current source 35, the current of which is equal to the current of constant current source 34 and is connected to $-V$.

The emitter of input transistor 21B is connected to one terminal of a second gain resistor 25B, the resistance of which is R2, and to the collector of an NPN gain selection transistor 28B. The emitter of gain selection transistor 28B is connected to conductor 45A, and its base is connected by conductor 42B to a second gain selection voltage $V_{R2}$. The emitter of input transistor 22B is connected to the other terminal of gain selection resistor 25B and to the collector of gain selection transistor 29B, the base of which is connected by conductor 42B to $V_{R2}$. The emitter of transistor 29B is connected to conductor 45B.

The collector of output transistor 43 is connected by conductor 53A to the inverting input of an operational amplifier 38 and to one terminal of a feedback resistor 48, the resistance of which is R. The output of operational amplifier 38 is connected to the other terminal of resistor 48 and by conductor 17 to $V_{OUT}$.

The collector of output transistor 44 is connected by conductor 53B to the non-inverting input of operational amplifier 38 and to one terminal of resistor 47, the resistance of which is R. The other terminal of resistor 47 is connected to ground.

An output current $I_{01}$ flows through conductor 53A into the collector of output transistor 43, and an output current $I_{02}$ flows through conductor 53B into the collector of output transistor 44.

One skilled in the art can recognize that if $V_{R1}$ is at a relatively low voltage and $V_{R2}$ is at a relatively high voltage, so that gain selection transistors 28A and 29A are off, no current will flow through the emitters of input transistors 21A and 22A, that gain resistor 25A is effectively switched out of the circuit, and the gain of the programmable gain amplifier is determined by gain resistor 25B, i.e., by $R_2$. Similarly, if $V_{R1}$ is at a high voltage and $V_{R2}$ is at a low voltage, gain selection transistors 28B and 29B are off, no current flows through input transistors 21B and 22B, gain resistor 25B is effectively switched out of the circuit, and the gain of the programmable gain amplifier of FIG. 3 is determined by gain resistor 25A, i.e., by $R_1$.

Other aspects of the operation of the programmable instrumentation amplifier of FIG. 3 can be understood by assuming that $V_{R1}$ is at a high voltage, and $V_{R2}$ is at a low voltage. Then it can be seen that the differential input voltage $\Delta V_{IN}$ appears directly across R1. This differential voltage across resistor R1 creates a differential current $\Delta I$ through $R_1$, which appears both as an incremental increase in $I_{02}$ and an incremental decrease in $I_{01}$. One skilled in the art will recognize that this occurs because the currents flowing through input transistors 21A and 22A are constant, because constant current sources 23 and 24 are equal, and because the constant current sources 34 and 35 are equal.

The two output currents $I_{01}$ and $I_{02}$ and the incremental increase and decrease therein flow through resistors 48 and 47, respectively, thereby producing an incremental decrease in the voltage across resistor 47 and an incremental increase in the voltage across resistor 48. The differential decrease in voltage across resistor 47 will be simply $\Delta I$ times R, and there will be an equal incremental increase across resistor 48, where $\Delta I$ is equal to $I_{02}$ minus $I_{01}$. Since the current difference $\Delta I$ is equal to $\Delta V_{IN}$ divided by $R_1$, the voltage gain expression for the amplifier in FIG. 3 is equal to $2R$ divided by $R_1$ if $V_{R1}$ is at a high voltage and $V_{R2}$ is at a low voltage, and is equal to $2R$ divided by $R_2$ if $V_{R2}$ is at a high voltage and $V_{R1}$ is low.

A typical value of R might be 30 kilohms, and values of $R_1$ and $R_2$ might be in the range from 60 ohms to 60 kilohms.

The bandwidth of the above-described programmable instrumentation gain amplifier can be quite high, typically more than one megahertz for gains of 1 to 100. If the amplifier gain exceeds about 100, some of the transistor parameter come into effect, resulting in reduced bandwidth. The gains of inverting amplifiers 46A and 46B can be quite low. My circuit simulations indicate that the circuit will function accurately with the gain of inverting amplifiers 46A and 46B as low as about 15.

When the instrumentation amplifier circuit of FIG. 3 is initially "balanced", i.e., when $V_{IN}$ equals 0, current sources 23 and 24 supply equal currents through the selected input transistors and gain selection transistors. If gain resistor $R_1$ is selected, the currents through transistors 28A and 29A are equal to $I_{01}$ and $I_{02}$. The voltages at the inputs of amplifiers 46A and 46B have established identical quiescent values.

To now understand the circuit operation, assume $V_{IN}$ is increased from zero to $\Delta V_{IN}$. That produces a voltage drop of $\Delta V_{IN}$ across R1 and a current equal to $\Delta V_{IN}$ divided by $R_1$ flows from the left-hand to the right-hand side of $R_1$. That current attempts to flow into the collector of transistor 29A and tends to increase the voltage of the emitter of transistor 22A, reducing its collector current. This in turn tries to reduce the current flowing through constant current source 24, thereby producing an increase in the voltage on conductor 49B. Inverting amplifier 46B produces a corresponding decrease in the voltage on conductor 50B, tending to reduce through the current through output transistor 44. That in turn allows more of the constant current from constant current source 35 to flow through transistor 29B, the collector voltage of which adjusts so that the current increment $\Delta V_{IN}$ divided by $R_1$ now has some place to flow. Since the current of current source 35 is constant, the increased flow through transistor 29B results in a decrease of $\Delta I$ in the output current $I_{02}$.

In a similar manner, essentially the opposite operation occurs in the left half of the instrumentation amplifier. The current $\Delta I$ flowing from left to right through resistor $R_1$ robs current that otherwise would flow through the collector of transistor 28B. This causes the emitter voltage of transistor 21A to decrease. This decrease turns transistor 21A on a bit harder, causing it to attempt to draw more current from constant current source 23. This reduces the voltage at the input of amplifier 46A, which produces a corresponding increase on conductor 50A, causing a corresponding increase in the portion of the constant current 34 that flows through output transistor 43, and producing an increase of $\Delta I$ in $I_{01}$.

Note that in "differential subsections" 56 and 57 of the programmable gain amplifier of FIG. 3, the current flowing through the selected gain selection transistor (i.e., 28A or 28B) is equal to the difference between the constant current source 23 and the current flowing through the selected gain resistor (i.e., resistor $R_1$ or $R_2$). Therefore, the collector current of the output transistor 43 must be equal to the signal $\Delta I$ current plus the difference between constant currents 23 and 34. Thus, when the two differential subsections 56 and 57 are connected together as shown in FIG. 3 to provide the instrumentation amplifier, the output current $I_{02}$ is equal to a constant plus the signal current I while the output current $I_{01}$ of the other side is a constant minus the signal current $\Delta I$. Of course, more than two selectable gain resistors and associated circuitry can be provided in the same manner as those described above.

It should be noted that the common mode signal component of $V_{IN}$ are not carried through to the inputs of the output amplifier 38. Therefore, resistor mismatches in the circuit do not limit the common mode rejection. The common mode rejection is primarily determined by the output impedances.

A major advantage of the circuit described in FIG. 3 is that only five additional devices, including two input transistors, two gain selection transistors, and one gain resistor, need to be added to provide yet another switchable gain value for the instrumentation amplifier.

Since the prior instrumentation amplifiers have utilized signals produced at the collectors of the input transistors to develop the output voltage, I believe that the instrumentation amplifier of FIG. 3 may be novel and highly useful even without the programmable gain feature.

Since the circuit operates on current steering principles, long settling times of signal "glitches" due to capacitive coupling produced by fast transitions of the switching voltages $V_{R1}$ and $V_{R2}$ are avoided. The high degree of symmetry of the circuit of FIG. 3 causes errors due to variations in transistor parameter to be cancelled out, and allows a high degree of symmetry in the IC chip layout, resulting in excellent thermal balance of the chip.

Figure 4:
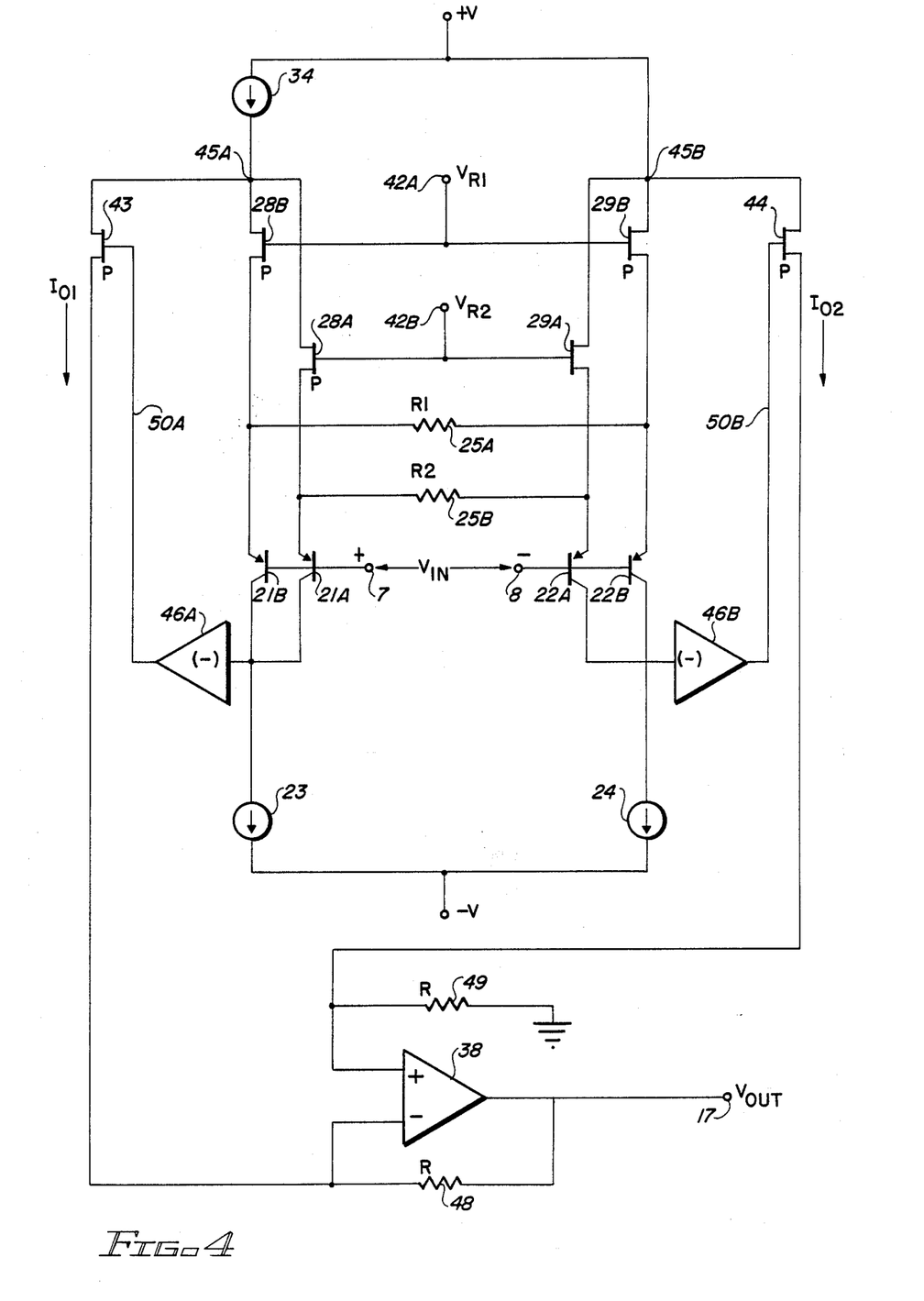
FIG. 4 is a detailed schematic circuit diagram of another embodiment of the invention.

Referring now to FIG. 4, an alternate, presently preferred embodiment of the invention is shown in which the output transistors 43 and 44, the gain selection transistors 28A, 28B, 29A, and 29B have been implemented with P-channel junction field effect transistors, which can be integrated in a monolithic "bi-fet" IC structure of many conventional bipolar IC manufacturing processes. The NPN input transistors of FIG. 3 have been replaced in FIG. 4 by PNP input transistors designated by the same reference numerals. The reason that I prefer the circuit of FIG. 4 over that of FIG. 3 is that the base currents of NPN gain selection transistors 28A, 28B, 29A, and 29B "add into" their respective emitter currents. Therefore, variations in those base currents can cause modulation of the corresponding collector currents. Since the emitter currents referred to are respectively determined by constant current sources 23 and 24, a change in the base current of one of the gain selection transistors results in a corresponding change in its collector current, and hence a change in the signal current flowing through the collector of selected gain resistor. This can result in an error in the instrumentation amplifier gain. In the circuit of FIG. 4, such error is avoided by utilizing P-channel junction field effect transistors as the gain resistor switching devices, because the gate current of such field effect transistors is negligible.

While the invention has been described with reference to several particular embodiments thereof, those skilled in the art will be able to make various modifications to the described embodiments without departing from the true spirit and scope of the invention. It is intended that all circuits which are equivalent in that they perform substantially the same function in substantially the same way to achieve the same result are to be encompassed by the invention.

I claim:

1. A programmable gain amplifier comprising in combination:
   (a) first, second, third, and fourth gain selection transistors, each having a control electrode and first and second current carrying electrodes, the control electrodes of the first and second gain selection transistors being connected to a first gain selection conductor, the control electrodes of the third and fourth gain selection transistors being connected to a second gain selection conductor;
   (b) first and second output transistors each having a control electrode and first and second current carrying electrodes, the first current carrying electrodes of the first output transistor and the first and third gain selection transistors being coupled to a first constant current source, the first current carrying electrodes of the second output transistor and the second and fourth gain selection transistors being connected to a second constant current source;
   (c) first, second, third, and fourth input transistors each having a control electrode and first and second current carrying electrodes, the first current carrying electrodes of the first, second, third, and fourth input transistors being connected, respectively to the second current carrying electrodes of the first, second, third, and fourth gain selection transistors, the control electrodes of the first and third input transistors being connected to a first input terminal, the control electrodes of the second and fourth input transistors being connected to a second input terminal, the second current carrying electrodes of the first and third input transistors being connected to a third constant current source, the second current carrying electrodes of the second and fourth input transistors being connected to a fourth constant current source;
   (d) a first gain resistor connected between the first current carrying electrodes of the first and second input transistors, and a second gain resistor connected between the first current carrying electrodes of the third and fourth input transistors;
   (e) means for biasing the control electrodes of the first and second output transistors;
   whereby first and second output currents flow through the second current carrying electrodes of the first and second output transistors, respectively, the gain of the amplifier being selectable to a first value determined by the first gain resistor by turning on the first and second gain selection transistors in response to a signal on the first gain selection conductor and turning off the third and fourth gain selection transistors, or to a second value determined by the second gain resistor by turning on the third and fourth gain selection transistors in response to a signal on the second gain selection conductor and turning off the first and second gain selection transistors.

2. The programmable gain amplifier of claim 1 wherein the biasing means includes a first inverting amplifier having an input coupled to the second current carrying electrodes of the first and third input transistors and an output coupled to the control electrode of the first output transistor, and a second inverting amplifier having an input connected to the second current carrying electrodes of the second and fourth input transistors and an output coupled to the control electrode of the second output transistor.

3. The programmable gain amplifier of claim 2 further including current to voltage conversion means coupled to the second current carrying electrodes of the first and second output transistors, respectively, for converting an incremental current difference between the first and second output currents to an amplified incremental output voltage.

4. The programmable gain amplifier of claim 3 wherein the current to voltage converting means includes an operational amplifier having first and second inputs, an output for producing the incremental output voltage and coupled by a first resistor to the first input and the second current carrying electrode of the first output transistor, and a second resistor coupled between a reference voltage conductor and the second current carrying terminal of the second output transistor, the second input of the operational amplifier being coupled to the second current carrying electrode of the second output transistor.

5. The programmable gain amplifier of claim 2 wherein the first, second, third, and fourth input transistors, the first, second, third, and fourth gain selection transistors, and the first and second output transistors are all NPN transistors.

6. The programmable gain amplifier of claim 2 wherein the first, second, third, and fourth gain selection transistors, and the first and second output transistors are bipolar transistors.

7. The programmable gain amplifier of claim 1 wherein the first and second output transistors are field effect transistors.

8. An amplifier comprising in combination:
   (a) first and second transistors, each having a control electrode and first and second current carrying electrodes, the control electrode of the first and second transistors being connected to receive a first voltage for turning the first and second transistors on;
   (b) first and second output transistors each having a control electrode and first and second current carrying electrodes, the first current carrying electrodes of the first output transistor and the first transistor being coupled to a first constant current source, the first current carrying electrodes of the second output transistor and the second transistor being connected to a second constant current source;
   (c) first and second input transistors each having a control electrode and first and second current carrying electrodes, the first current carrying electrodes of the first and second input transistors being connected, respectively to the second current carrying electrodes of the first and second transistors, the control electrode of the first input transistor being connected to a first input terminal, the control electrode of the second input transistor being connected to a second input terminal, the second current carrying electrode of the first input transistor being connected to a third constant current source, the second current carrying electrode of the second input transistor being connected to a fourth constant current source;

(d) a first gain resistor connected between the first current carrying electrodes of the first and second input transistors;

(e) means for biasing the control electrodes of the first and second output transistors;

whereby first and second output currents flow through the second current carrying terminals of the first and second output transistors.

9. A method of programming discrete selectable gains of an amplifier, the method comprising the steps of:

(a) applying a first gain selection voltage to control electrodes of first and second gain selection transistors to turn them both on while applying a deselect voltage to control electrodes of third and fourth gain selection transistors to turn them off;

(b) applying a first differential voltage between a first terminal coupled to control electrodes of first and second input transistors and a second terminal coupled to third and fourth input transistors;

(c) causing current from the first and second gain selection transistors to also flow through the first and third input transistors, and causing a second differential voltage equal to the first differential voltage to be produced between a first current carrying terminal of the first input transistor and a first current carrying terminal of the third input transistor;

(d) applying the second differential voltage across a first gain resistor to produce a corresponding current flowing through the first gain resistor, the off condition of the third and fourth gain selection transistors preventing current from flowing through the second and fourth input transistors or through a second gain resistor;

(e) subtracting the current flowing through the first gain resistor from the current flowing through the first gain select transistor to produce a corresponding change in a first output current flowing through a first output transistor, and adding the current flowing through the first gain resistor to the current flowing through the second gain select transistor to produce a corresponding change in a second output current flowing through a second output transistor;

(f) applying the first gain selection voltage to the control electrodes of the third and fourth gain selection transistors to turn them on while applying the deselect voltage to the control electrodes of the first and second gain selection transistors to turn them off;

(g) repeating step (b);

(h) causing current from the third and fourth gain selection transistors to also flow through the second and fourth input transistors, and causing a second differential voltage equal to the first differential input voltage to be produced between a first current carrying terminal of the second input transistor and a first current carrying terminal of the fourth input transistor;

(i) applying the second differential voltage across the second gain resistor to produce a corresponding current flow through the first gain resistor, the off condition of the first and second gain selection transistors preventing current from flowing through the first and third input transistors or the first gain resistor;

(j) subtracting the current flowing through the second gain resistor from the current flowing through the third gain select transistor to produce a corresponding change in the first output current flowing through the first output transistor, and adding the current flowing through the second gain resistor to the current flowing in the fourth gain select transistor to produce a corresponding change in the second output current flowing through the second output transistor;

whereby selection of the first gain resistor results in a first gain ratio between the first differential voltage and the changes in the first and second output currents and selection of the second gain resistor produces a second ratio between the first differential voltage and the changes produced in the first and second output currents.

10. A programmable gain amplifier comprising in combination:

(a) first and second gain selection transistors, each having a control electrode and first and second current carrying electrodes, the control electrode of the first gain selection transistor being connected to a first gain selection conductor, the control electrode of the second gain selection transistor being connected to a second gain selection conductor;

(b) a first output transistor having a control electrode and first and second current carrying electrodes, the first current carrying electrodes of the first output transistor and the first and second gain selection transistors being coupled to a first current source, the second current carrying electrode of the first output transistor being coupled to an output conductor of the programmable gain amplifier;

(c) first and second input transistors each having a control electrode and first and second current carrying electrodes, the first current carrying electrodes of the first and second input transistors being connected, respectively, to the second current carrying electrodes of the first and second gain selection transistors, the control electrodes of the first and second input transistors being connected to an input terminal, the second current carrying electrodes of the first and second input transistors being connected to a second current source;

(d) a first gain resistor connected to the first current carrying electrode of the first input transistor, and a second gain resistor connected to the first current carrying electrode of the second input transistor;

(e) means for biasing the control electrode of the first output transistor, the gain of the amplifier being selectable to a first value determined by the first gain resistor by turning on the first gain selection transistor in response to a signal on the first gain selection conductor and turning off the second gain selection transistor, or to a second value determined by the second gain resistor by turning on the second gain selection transistor in response to a signal on the second gain selection conductor and turning off the second gain selection transistor, wherein the biasing means includes a first inverting amplifier having an input coupled to the second current carrying electrodes of the first and second input transistors and an output coupled to the control electrode of the first output transistor.

* * * * *

UNITED STATES PATENT AND TRADEMARK OFFICE
CERTIFICATE OF CORRECTION

PATENT NO. : 4,833,422

DATED : 5/23/89

INVENTOR(S) : Robert N. Atwell

It is certified that error appears in the above-identified patent and that said Letters Patent is hereby corrected as shown below:

In Fig. 4 (sheet 3 of 3 of above patent), the current source symbol, reference numeral 35, and its associated lead should be added, as shown on the attached copy of Fig. 4.

Signed and Sealed this

Twenty-third Day of February, 1993

Attest:

STEPHEN G. KUNIN

Attesting Officer

Acting Commissioner of Patents and Trademarks

FIG. 4